United States Patent
Wallace et al.

(10) Patent No.: US 9,257,894 B2
(45) Date of Patent: Feb. 9, 2016

(54) RECONFIGURABLE PASSIVE FILTER

(71) Applicant: TCI, LLC, Germantown, WI (US)

(72) Inventors: Ian Wallace, Whitefish Bay, WI (US);
Ashish Bendre, Shorewood, WI (US);
Neil Wood, Brown Deer, WI (US);
William Kranz, Fox Point, WI (US)

(73) Assignee: TCI, LLC, Germantown, WI (US)

( * ) Notice: Subject to any disclaimer, the term of this patent is extended or adjusted under 35 U.S.C. 154(b) by 0 days.

(21) Appl. No.: 14/502,397

(22) Filed: Sep. 30, 2014

(65) Prior Publication Data

US 2015/0091640 A1 Apr. 2, 2015

Related U.S. Application Data

(60) Provisional application No. 61/885,271, filed on Oct. 1, 2013.

(51) Int. Cl.
| | |
|---|---|
| *H03B 1/00* | (2006.01) |
| *H02M 1/12* | (2006.01) |
| *H03H 7/42* | (2006.01) |
| *H03H 7/01* | (2006.01) |

(52) U.S. Cl.
CPC ............... *H02M 1/12* (2013.01); *H02M 1/126* (2013.01); *H03H 7/427* (2013.01); *H03H 7/0153* (2013.01); *H03H 7/1758* (2013.01)

(58) Field of Classification Search
CPC ......... H02J 3/01; H02J 3/1807; H02J 3/1828; H02M 1/12; H02M 1/126; H03H 7/09; H03H 7/1758
See application file for complete search history.

(56) References Cited

U.S. PATENT DOCUMENTS

| | | | | |
|---|---|---|---|---|
| 6,339,265 B1 * | 1/2002 | Levin | ......................... | H02J 3/01 307/105 |
| 6,549,434 B2 * | 4/2003 | Zhou | ......................... | H02J 3/01 307/105 |
| 6,844,794 B2 * | 1/2005 | Lauri | ......................... | H02J 3/01 333/12 |
| 7,459,995 B2 * | 12/2008 | Suzuki | ................... | H02H 9/005 333/172 |
| 8,212,416 B2 * | 7/2012 | Navid | ..................... | H01F 17/04 307/105 |
| 9,083,234 B2 * | 7/2015 | Shudarek | .............. | H02M 1/126 |

* cited by examiner

*Primary Examiner* — Jeffrey Zweizig
(74) *Attorney, Agent, or Firm* — Nicholas A. Kees; Godfrey & Kahn, S.C.

(57) ABSTRACT

A passive filter for connection between an AC source and a load, in either three-phases or in a single-phase arrangement. The filter includes, for each phase, a trap circuit having an inductor in series with a capacitor, the trap circuit having at least two terminals. A line reactor is connected between the AC source and the load, the line reactor having at least an input terminal, an output terminal and a tap terminal. A switch selectively connects at least one of the trap circuit terminals to a selected one of the line reactor terminals. The switch is capable of selecting which of the trap circuit terminals to connect to which of the line reactor terminals on the basis of a level of voltage distortion being experienced by the AC source, or on the basis of a calculated level of background voltage total harmonic distortion.

16 Claims, 8 Drawing Sheets

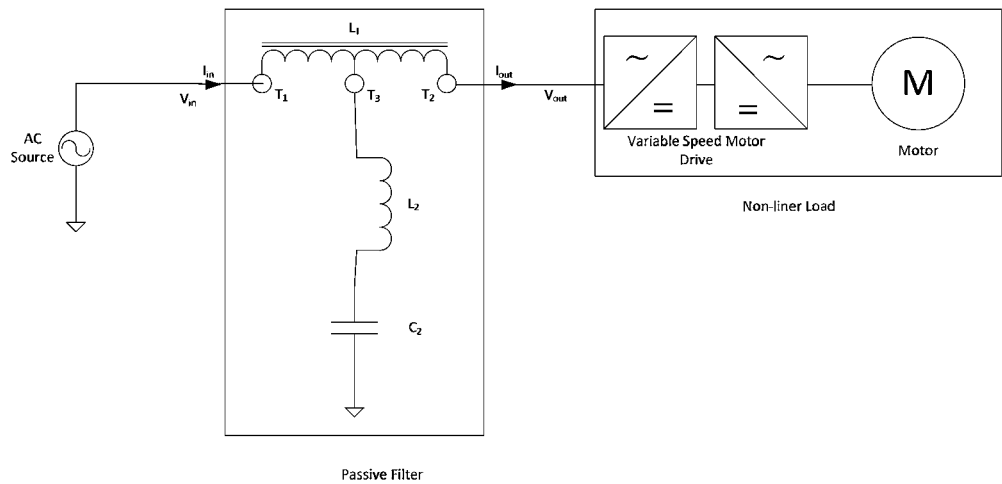
FIG. 1 – PRIOR ART
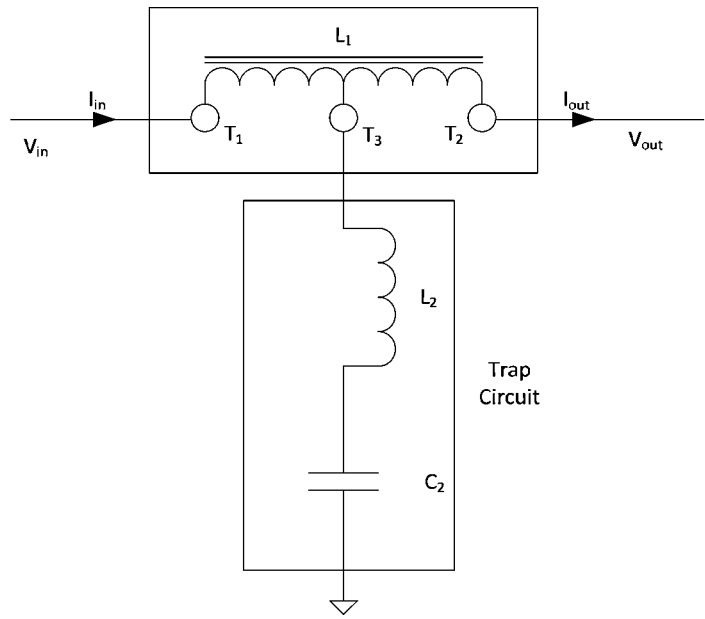
FIG. 2 – PRIOR ART

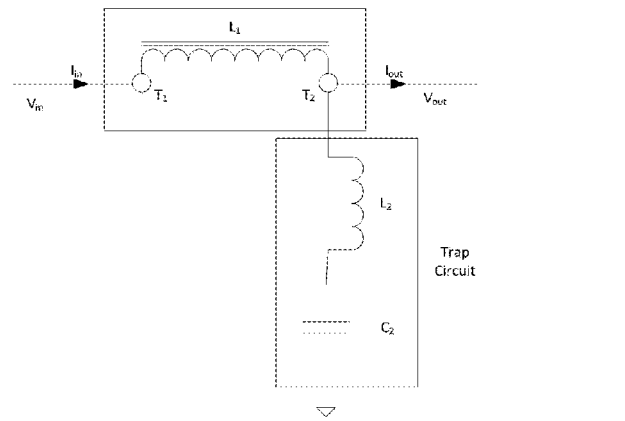
FIG. 3 – PRIOR ART
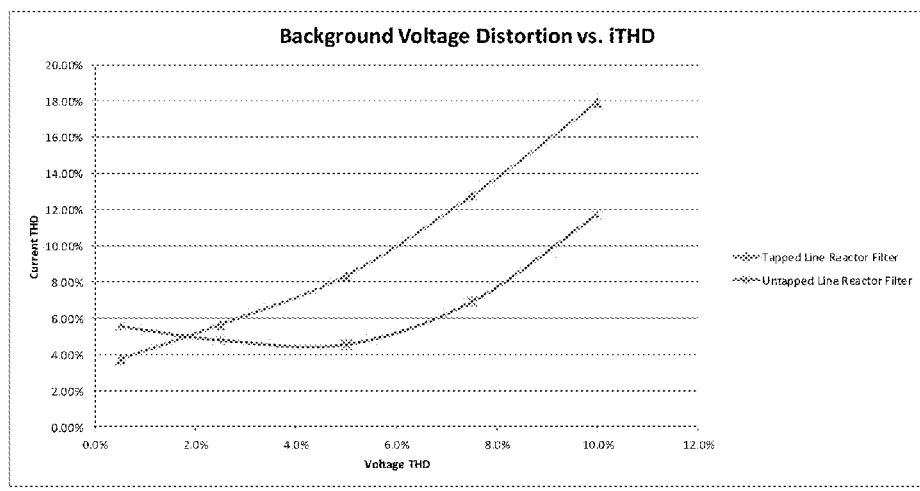
FIG. 4

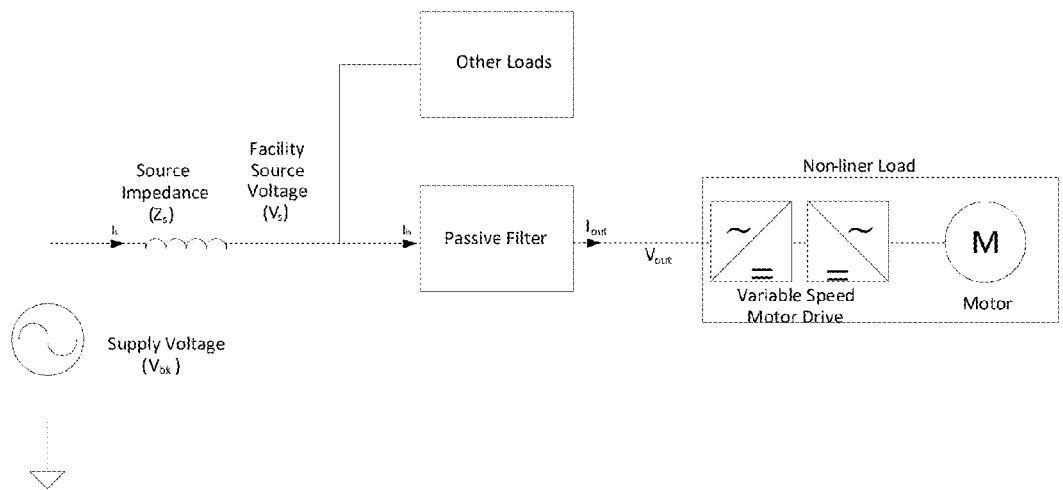
FIG. 5 – PRIOR ART
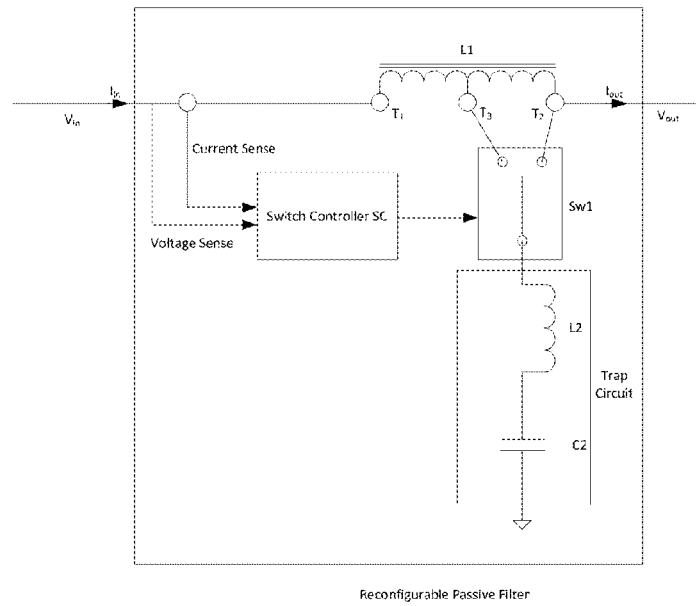
FIG. 6.

RECONFIGURABLE PASSIVE FILTER

CROSS REFERENCE TO RELATED APPLICATION

This application claims the benefit of Provisional Patent Application Ser. No. 61/885,271, filed Oct. 1, 2013.

FIELD OF THE INVENTION

The present invention relates generally to the field of controlling electrical loads. More particularly, the present invention relates to accommodating varying levels of distortion in a passively filtered system, either three-phase or single phase.

BACKGROUND

Non-linear electric loads such as variable frequency motor drives with diode rectifier inputs draw current from an AC sinusoidal voltage source at multiple frequencies, that is, at the fundamental frequency of the AC source, and also at harmonic multiples of the fundamental frequency. The currents drawn at harmonic frequencies are undesirable, and considered distortion. Passive filters are commonly used to reduce the amount of undesirable harmonic current flowing from the load into the AC source. As an example, an input passive filter placed between the AC source and the harmonic load, as shown in FIG. 1, will reduce the harmonic currents flowing in the source ($I_{in}$) as compared to the harmonic load ($I_{out}$).

The purpose of the input passive filter is to reduce the amount of harmonic current flowing in the source. This is primarily accomplished by providing a trap circuit ($L_2/C_2$ in FIG. 2) that has low impedance at the relevant harmonic frequency, thus attracting the load harmonic currents to flow in the trap circuit and not in the source. The line reactor $L_1$ further impedes the harmonic currents from flowing in the source. The trap circuit is connected to the line reactor tap terminal $T_3$ for optimal harmonic performance.

Another passive filter implementation is shown in FIG. 3, wherein the line reactor $L_1$ does not have a tap terminal, and the trap is connected to the line reactor end terminal $T_2$. Under ideal electrical system conditions, with a sinusoidal ac voltage source, the passive filter circuit topology shown in FIG. 2 is a higher performing filter (achieves lower source current harmonic levels) for variable speed motor drive loads than the filter shown in FIG. 3.

Under non-ideal and real world conditions, the AC voltage source is not purely sinusoidal, sometimes containing up to 1%-5% background distortion (1%-5% rms voltage at harmonic frequencies of the fundamental) or more. In remote locations, such as rural oil fields, the voltage source can experience voltage distortion exceeding 10%. Background voltage distortion is defined as the distortion in the voltage provided by the electric utility or generator. It is equivalent to the distortion level of the input AC voltage with loads not operating or drawing current. As loads are added to the power system within a facility, additional voltage distortion will be produced by their harmonic load currents. The presence and level of background voltage distortion can significantly lower the performance of some passive filters, depending on the filter topology. As shown by the graph in FIG. 4, the tapped line reactor filter shown in FIG. 2 outperforms the non-tapped line reactor filter shown in FIG. 3 at low input background voltage distortion. However, at higher background voltage distortion, such as distortion greater than 2% vTHD (voltage total harmonic distortion), the non-tapped line reactor filter shown in FIG. 3 outperforms the tapped filter shown in FIG. 2 and produces a lower current THD.

It is known in the field that connecting the trap to the tapped terminal $T_3$ as shown in FIG. 2 will improve the performance of the filter under normal voltage conditions (vTHD<1%), compared to connecting the trap the end terminal $T_2$ as shown in FIG. 3. Passive filter topologies can be optimally built for low input voltage distortion (FIG. 2) or for high input voltage distortion (FIG. 3).

As the background AC voltage distortion varies over time at any given location on the AC network, a passive filter that provides optimal performance under any input distortion condition is needed.

SUMMARY OF THE INVENTION

The invention provides a passive filter for connection between an AC source and a load, in either a three-phase system or a single phase system. According to the invention, the passive filter includes a trap circuit, having an inductor in series with a capacitor, the trap circuit having at least two terminals. A line reactor is connected between the AC source and the load, the line reactor having at least an input terminal, an output terminal and a tap terminal. A switch selectively connects at least one of the trap circuit terminals to a selected one of the line reactor terminals. The switch can select which of the trap circuit terminals to connect to which of the line reactor terminals on the basis of a level of voltage distortion being experienced by the AC source, or on the basis of a level of background voltage total harmonic distortion calculated using the source voltage, source current and source impedance. The switch can be, among other things, a mechanical contactor, a semi-controlled AC semiconductor switch, or a fully controlled AC semiconductor switch. The line reactor may include multiple selectable tap terminals, and the switch may be capable of automatically selecting which terminal to connect, based on sensed signals of at least the input voltage and current, so as to select the best performing connection based upon the distortion being experienced by the AC source.

In a three-phase system, the invention provides a three-phase passive filter. The trap circuit includes a three-phase inductor in combination with a three-phase capacitor, and the trap circuit has at least three terminals. The line reactor is also three-phase, connected between the AC source and the load, the line reactor having at least an input terminal, an output terminal and a tap terminal for each of the three phases. A three-phase switch is provided, for selectively connecting at least one of the trap circuit terminals within each phase to a selected one of the line reactor terminals within that respective phase. The three phase capacitor can be connected in a wye configuration, or in a delta configuration.

Other objects and advantages of the invention will become apparent hereinafter.

DESCRIPTION OF THE DRAWING FIGURES

FIG. 1 is a schematic diagram of a conventional filtered power circuit, including source and load.

FIG. 2 is a schematic diagram of a portion of the conventional filtered power circuit shown in FIG. 1, enlarged to show further detail.

FIG. 3 is a schematic diagram of a portion of another conventional filtered power circuit.

FIG. 4 is a graph showing a relationship between background voltage distortion and load current distortion.

FIG. 5 is a schematic diagram of a conventional filtered power circuit, including a source and multiple loads.

FIG. 6 is a schematic diagram of a filtered power circuit, including source and load, constructed according to one embodiment of the present invention.

DETAILED DESCRIPTION

Figure 7:
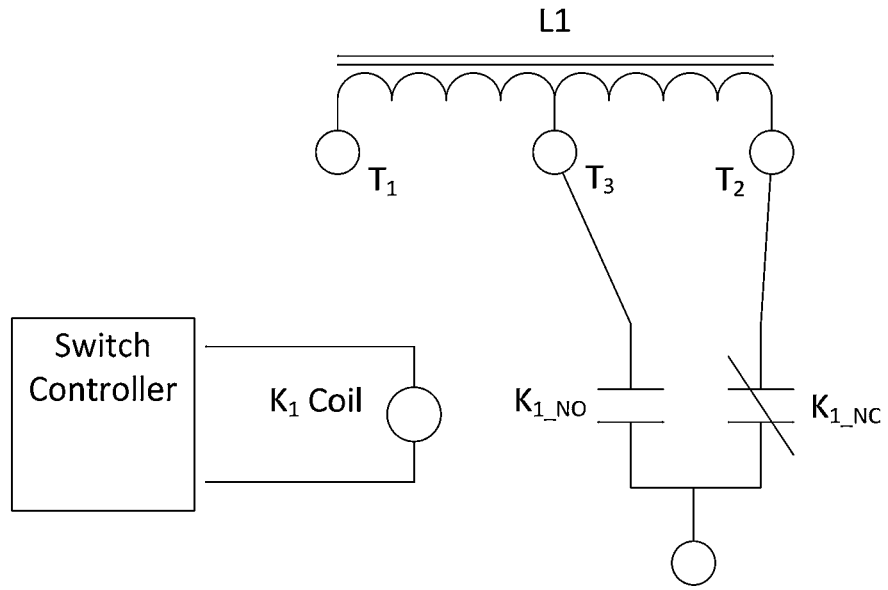
FIG. 7 is a schematic diagram of a portion of the filtered power circuit shown at FIG. 6, enlarged to show certain detail.

The inventors have discovered that changing the location of trap from the tapped terminal $T_3$ to the end terminal $T_2$ will improve the performance of the filter under high background voltage distortion conditions, that is, where vTHD exceeds 2%, as shown in the graph in FIG. 4. As a result of this new understanding, the filter in FIG. 3 is preferred for high background distortion applications while the filter in FIG. 2 is preferred for normal voltage distortion applications where the vTHD is less than 2%. But neither filter is optimal at all times, if the level of distortion can vary more widely than that.

The present invention therefore provides a reconfigurable passive filter to accommodate varying input distortion. Shown in FIG. 6 is one embodiment of the invention. Shown there is a passive filter that can reconfigured to produce the lowest current iTHD in the presence of varying AC voltage vTHD. The filter shown in FIG. 6 includes a tapped line reactor $L_1$ with input terminal $T_1$, output terminal $T_2$, and tap terminal $T_3$. The filter further includes a trap circuit formed by inductor $L_2$ and capacitor $C_2$, a switch $SW_1$ and a switch controller SC. In the simplest embodiment, the switch $SW_1$ connects the trap circuit to either terminal $T_2$ or $T_3$ to minimize current iTHD. The inputs to the switch controller SC are the source voltage and source current. If the source voltage distortion level is greater than a minimum threshold (high vTHD), the trap circuit is switched to the end terminal $T_2$ to put into effect the filter topology that is most effective with high vTHD conditions. If the source voltage distortion level is less than a minimum threshold (low vTHD), the trap circuit is switched to the tap terminal $T_3$ to put into effect the filter topology that is most effective with low background vTHD conditions. Using solely the input voltage signal as an estimate of the background voltage and to select the filter is optimal if the load is off. If the load is not drawing current or the current level is low, background voltage distortion can be directly measured from the input AC voltage signal. To more accurately determine the background voltage while the load is on may require knowledge of the source voltage, source current and source impedance, such as by means of sensors. As is generally understood in electrical power systems, the background voltage $V_{bk}$ provided by the utility and the source voltage at a facility $V_s$ can be described by the equation:

$$V_s = V_{kb} + I_s * Z_s \qquad (1)$$

where $Z_s$ is the source impedance and $I_s$ is the facility source current as shown in FIG. 5.

The source impedance is typically comprised of cables and transformer impedances in the electrical distribution system from the original source of generation of the power to the facility. In cases where the either the filter input current ($I_{in}$) or the source impedance are high, the contribution of the voltage across the source impedance due to the input current, $I_{in}*Z_s$, can be a significant portion of the source voltage. In these cases, a means to more accurately estimate the background voltage may be necessary to accurately select the optimal filter configuration and identify the background voltage that would be present at the input to the filter, if the filter was not operating. This can be done, for example, by measuring source voltage and measuring filter input current, and estimating the source impedance ($Z_{s\_estimate}$):

$$V_{bk\_estimate} = V_s - I_{in} * Z_{s\_estimate} \qquad (2)$$

The switch controller or means for selecting the different taps can be implemented in multiple ways. In one embodiment as shown in FIG. 7, the switch controller is an electromechanical contactor or relay.

Figure 8:
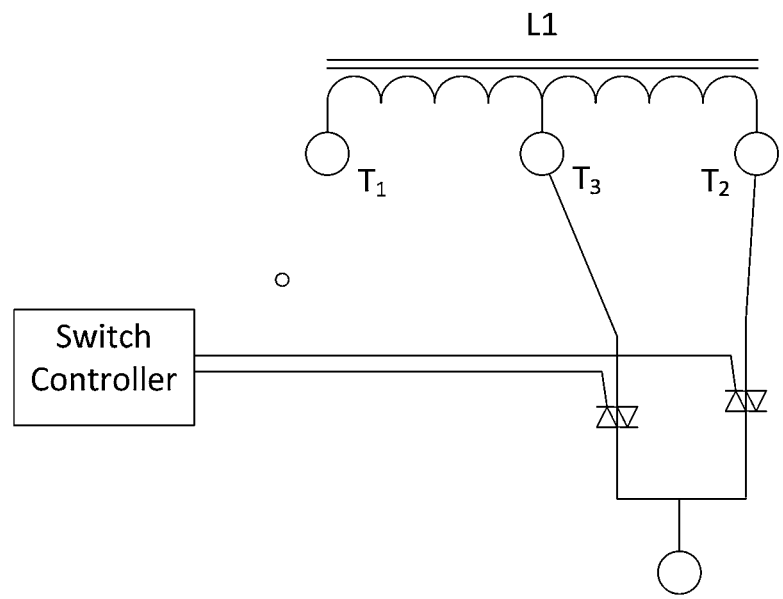
FIG. 8 is a schematic diagram of a filtered power circuit constructed according to another embodiment of the present invention.

In another embodiment as shown in FIG. 8, the switch controller is a semi-controlled AC semiconductor switch, that is, back to back silicon controlled rectifiers (SCRs).

Figure 9:
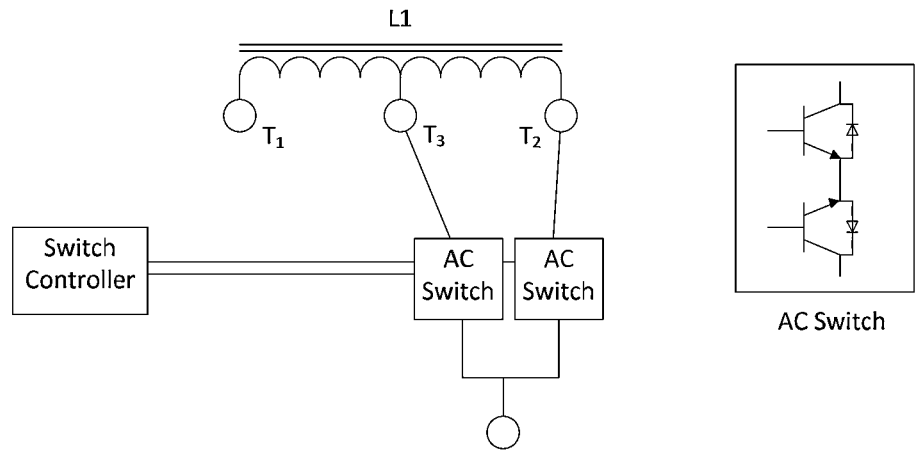
FIG. 9 is a schematic diagram of a filtered power circuit constructed according to yet another embodiment of the present invention.

In another embodiment as shown in FIG. 9, the switch controller is a fully controlled AC semiconductor switch, using forward blocking transistors.

Figure 10:
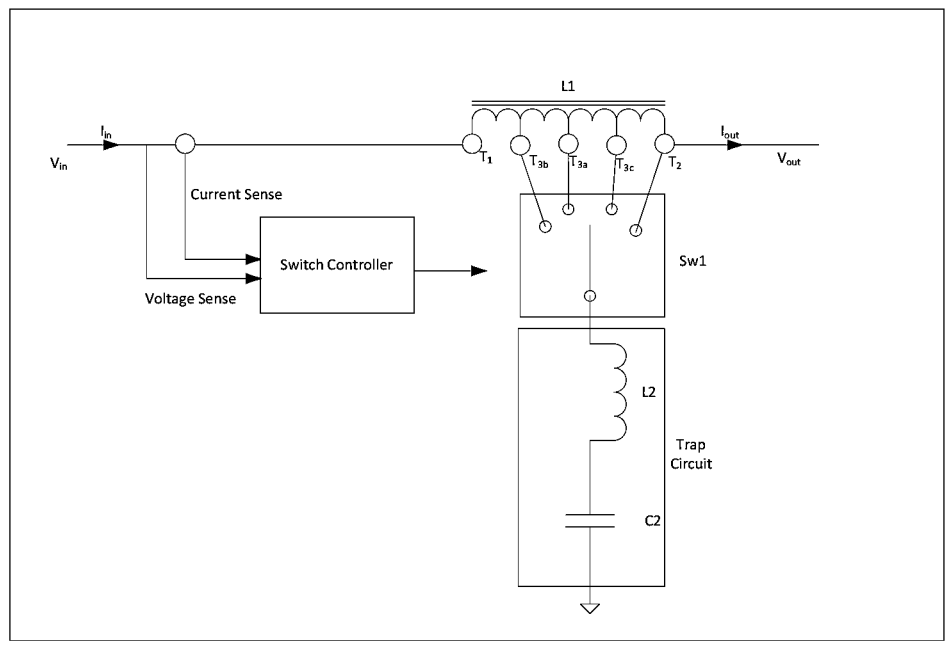
FIG. 10 is a schematic diagram of a filtered power circuit constructed according to still another embodiment of the present invention, with a range of taps.

The invention can also be realized with multiple tap terminals, which allow performance of the filter to be optimized over a wider range of conditions. Such an embodiment is shown in FIG. 10, where the line inductor $L_1$ has multiple selectable taps, labeled $T_{3a}$, $T_{3b}$ and $T_{3c}$. The performance of the filter, with a range of taps, is shown in FIG. 11.

Figure 12:
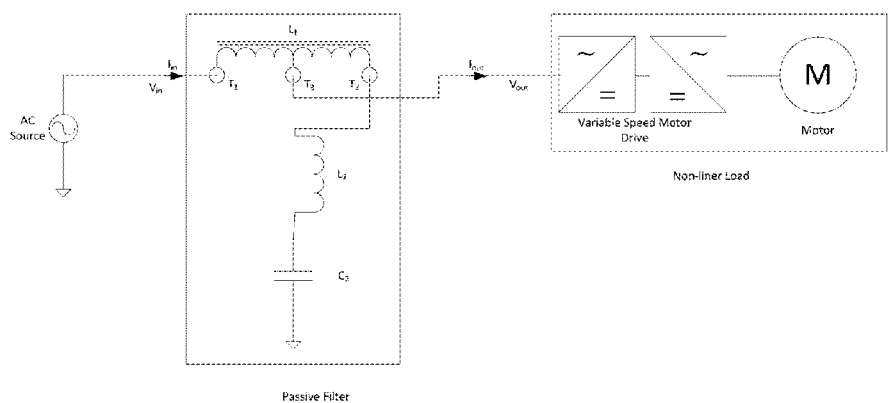
FIG. 12 is a schematic diagram of a filtered power circuit, including source and load, constructed according to an embodiment of the present invention with a reverse tap filter.
Figure 13:
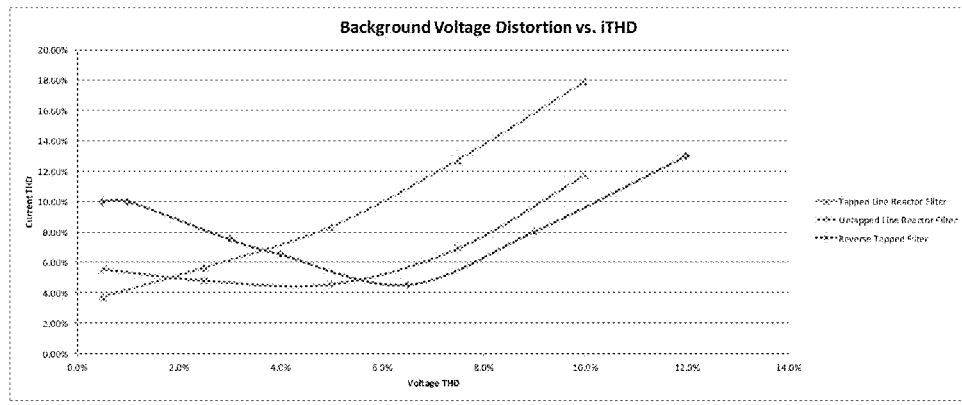
FIG. 13 is a graph showing a relationship between background voltage distortion and load current distortion, with the reverse tap filter shown in FIG. 12.

Furthermore, this invention can be extended to a "reverse tap filter" configuration, as shown in FIG. 12. In this embodiment, the location of the filter trap circuit and the output (drive connection) is reversed from the typical tap filter shown in FIG. 2. In the reverse tap filter configuration shown in FIG. 12, the trap circuit is connected to terminal $T_2$ and the output motor drive is connected to the tap terminal $T_3$. Performance of this filter under high background distortion is superior to the conventional filter configurations in FIGS. 2 and 3, but it has lower performance at low voltage distortion, as shown in FIG. 13.

Figure 11:
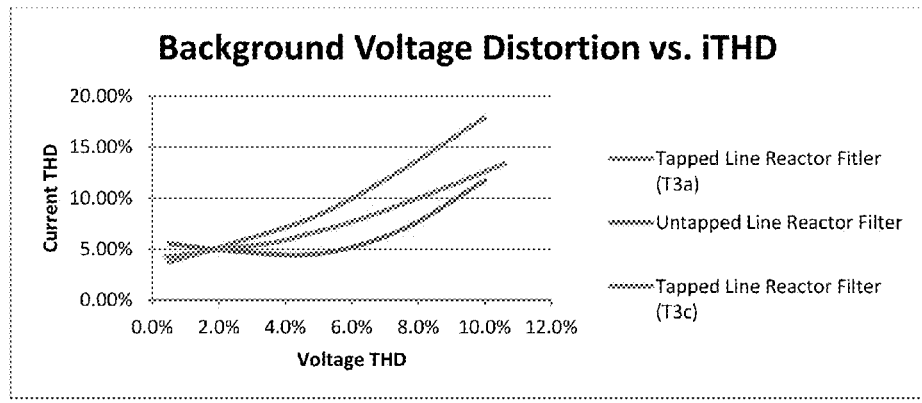
FIG. 11 is a graph showing a relationship between background voltage distortion and load current distortion, with the range of taps shown in FIG. 10.
Figure 14:
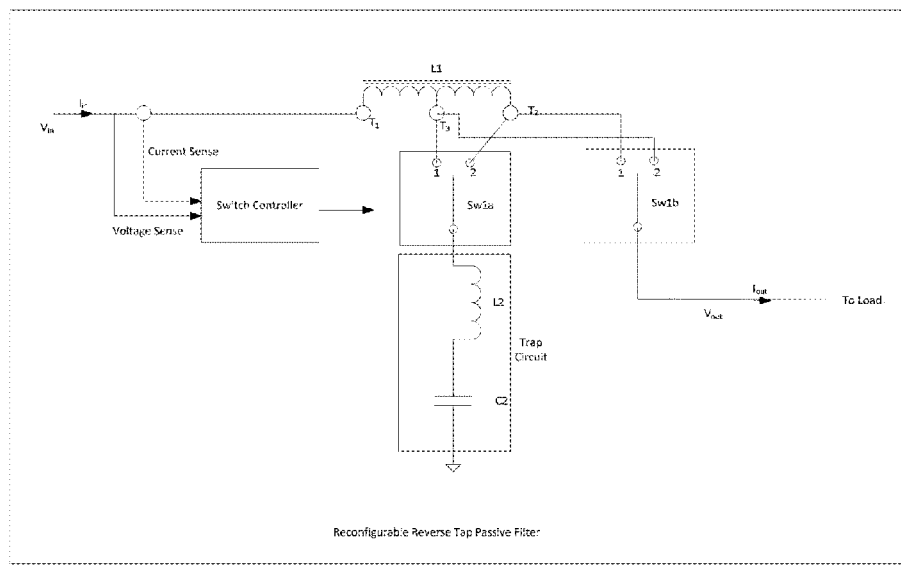
FIG. 14 is a schematic diagram of a filtered power circuit constructed according to an additional embodiment of the present invention.

An automatically reconfigurable filter that can switch between the optimal low background distortion filter and the best performing high background distortion filter shown in FIG. 11 is shown in FIG. 14. The switching conditions are based on measurements of the electrical system voltage distortion and use of multi-pole multi-throw switch SW1.

Figure 15:
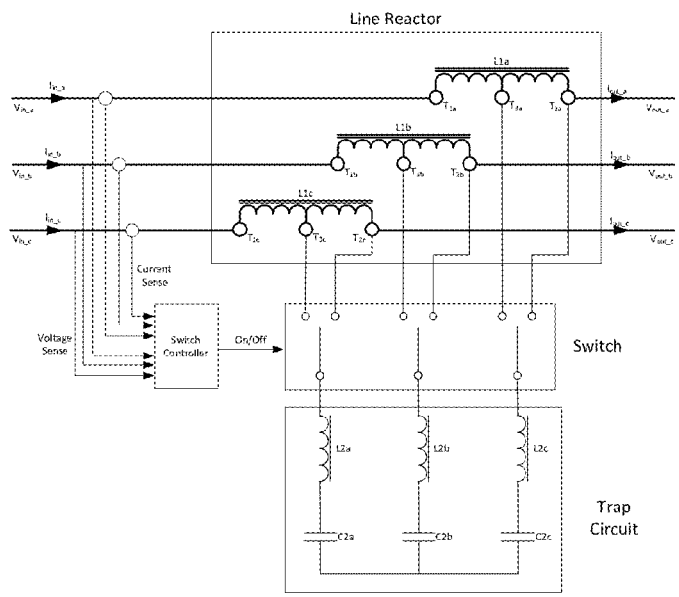
FIG. 15 is a schematic diagram of a filtered power circuit wherein the invention has been applied to a three-phase power system, with the capacitor of the trap circuit arranged in a wye configuration.
Figure 16:
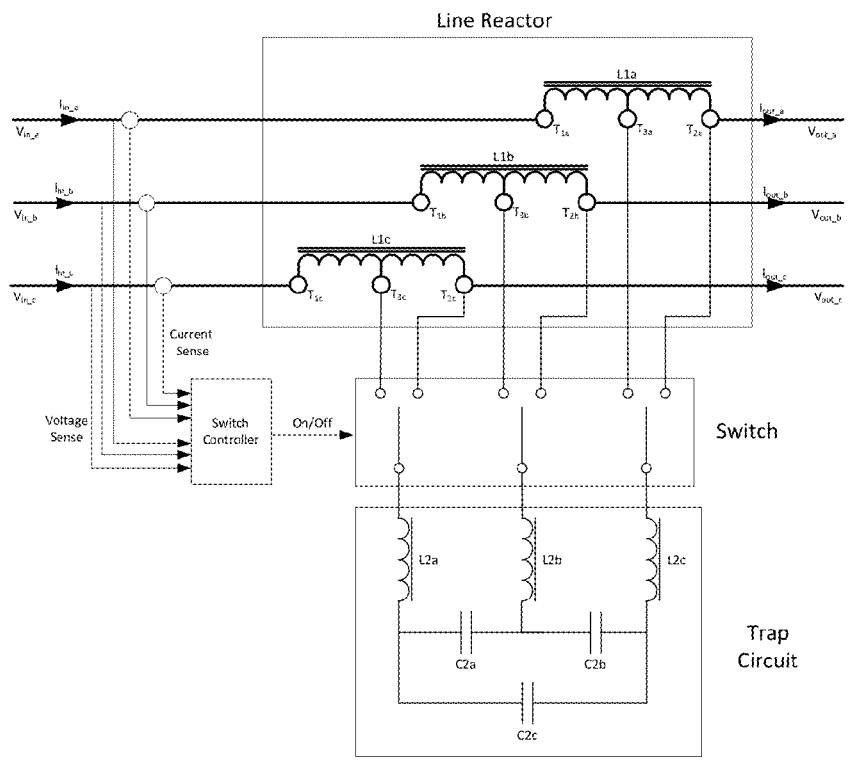
FIG. 16 is a schematic diagram of a filtered power circuit wherein the invention has been applied to a three-phase power system, wherein the capacitor of the trap circuit is arranged in a delta configuration.

As shown in FIGS. 15 and 16, the invention can be just as easily applied in a three-phase environment. FIG. 15 shows a three-phase AC source delivering power to a three-phase load, by means of a three-phase line reactor, shown there as inductors L1a, L1b and L1c. Each of the three inductors includes its respective taps $T_2$ and $T_3$. The switch controller controls a gang switch that, similar to the way described above, selects all the taps $T_2$ or all the taps $T_3$, depending on the voltage distortion level vTHD. In FIG. 15, the capacitors of the trap circuit are shown connected in a wye configuration, whereas in FIG. 16, the capacitors are shown connected in a delta configuration. The descriptions above, relating to multiple tap terminals, reverse taps, and switching conditions being based on measurements of the electrical system voltage distortion, all apply equally well in the three-phase environment.

Although the invention has been herein described in what is perceived to be the most practical and preferred embodiments, it is to be understood that the invention is not intended to be limited to the specific embodiments set forth above. Rather, it is recognized that modifications may be made by one of skill in the art of the invention without departing from the spirit or intent of the invention and, therefore, the invention is to be taken as including all reasonable equivalents to the subject matter of the appended claims and the description of the invention herein.

What is claimed is:

1. A passive filter for connection between an AC source and a load, the passive filter comprising:
    a trap circuit, comprising an inductor in series with a capacitor, the trap circuit having at least two terminals;
    a line reactor connected between the AC source and the load, the line reactor having at least an input terminal, an output terminal and a tap terminal;
    a switch for selectively connecting at least one of the trap circuit terminals to a selected one of the line reactor terminals.

2. A passive filter as claimed in claim 1 wherein the switch selects which of the trap circuit terminals to connect to which of the line reactor terminals on the basis of a level of voltage distortion being experienced by the AC source.

3. A passive filter as claimed in claim 1 wherein the switch selects which of the trap circuit terminals to connect to which of the line reactor terminals on the basis of a level of background voltage total harmonic distortion calculated using the source voltage, source current and source impedance.

4. A passive filter as claimed in claim 1 wherein the switch is a mechanical contactor.

5. A passive filter as claimed in claim 1 wherein the switch is a semi-controlled AC semiconductor switch.

6. A passive filter as claimed in claim 5 wherein the switch is a semi-controlled AC semiconductor switch comprising back to back silicon controlled rectifiers.

7. A passive filter as claimed in claim 1 wherein the switch is a fully controlled AC semiconductor switch.

8. A passive filter as claimed in claim 7 wherein the switch is a fully controlled AC semiconductor switch, including forward blocking transistors.

9. A passive filter as claimed in claim 1 wherein the line reactor includes multiple selectable tap terminals.

10. A passive filter as claimed in claim 9 wherein the switch is configured to automatically select which terminal to connect, based on sensed signals of at least the input voltage and current, so as to select the best performing connection based upon the distortion being experienced by the AC source.

11. A passive filter as claimed in claim 10 wherein the switch is a multi-pole multi-throw switch.

12. A passive filter for connection between an AC source and a load, the passive filter comprising:
    a trap circuit, comprising an inductor in series with a capacitor, the trap circuit having at least two terminals;
    a line reactor connected between the AC source and the load, the line reactor having at least an input terminal, an output terminal and a tap terminal;
    a switch for selectively connecting at least one of the line reactor terminals to the load based on the voltage distortion experienced by the AC source.

13. A passive filter for connection between an AC source and a load, the passive filter comprising:
    a trap circuit, comprising an inductor in series with a capacitor, the trap circuit having at least two terminals;
    a line reactor connected between the AC source and the load, the line reactor having at least an input terminal, an output terminal and multiple selectable tap terminals;
    a switch for selectively connecting at least one of the trap circuit terminals to a selected one of the line reactor terminals;
    wherein the switch automatically selects which of the trap circuit terminals to connect to which of the line reactor terminals on the basis of a level of voltage distortion being experienced by the AC source.

14. A three-phase passive filter for connection between a three-phase AC source and a three-phase load, the passive filter comprising:
    a trap circuit, comprising a three-phase inductor in combination with a three-phase capacitor, the trap circuit having at least three terminals;
    a three-phase line reactor connected between the AC source and the load, the line reactor having at least an input terminal, an output terminal and a tap terminal for each of the three phases;
    a three-phase switch for selectively connecting at least one of the trap circuit terminals within each phase to a selected one of the line reactor terminals within that respective phase.

15. A three-phase passive filter as claimed in claim 14 wherein the three phase capacitor is connected in wye configuration.

16. A three-phase passive filter as claimed in claim 14 wherein the three phase capacitor is connected in delta configuration.

* * * * *